US012236175B1

(12) United States Patent
Li et al.

(10) Patent No.: US 12,236,175 B1
(45) Date of Patent: Feb. 25, 2025

(54) METHOD AND SYSTEM FOR CORRELATING HYDRO-TURBINE GOVERNING SYSTEM CONTROL PARAMETERS AND OSCILLATION CHARACTERISTICS

(71) Applicant: HUAZHONG UNIVERSITY OF SCIENCE AND TECHNOLOGY, Hubei (CN)

(72) Inventors: Chaoshun Li, Hubei (CN); Xueding Lu, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/666,735

(22) Filed: May 16, 2024

(30) Foreign Application Priority Data

Nov. 30, 2023 (CN) .............................. 202311620353

(51) Int. Cl.
*G06F 30/28* (2020.01)
*H02P 101/10* (2015.01)

(52) U.S. Cl.
CPC .......... *G06F 30/28* (2020.01); *H02P 2101/10* (2015.01)

(58) Field of Classification Search
CPC ...................... G06F 30/28; H02P 2101/10
See application file for complete search history.

(56) References Cited

FOREIGN PATENT DOCUMENTS

| CN | 105425612 |   | 3/2016 |
|----|-----------|---|--------|
| CN | 104503228 B | * | 2/2017 |
| CN | 110032770 |   | 7/2019 |
| CN | 114329835 A | * | 4/2022 |
| CN | 115663844 |   | 1/2023 |

OTHER PUBLICATIONS

Lai X, Huang H, Zheng B, Li D, Zong Y. Nonlinear modeling and stability analysis of asymmetric hydro-turbine governing system. Applied Mathematical Modelling. Aug. 1, 2023;120:281-300. (Year: 2023).*

(Continued)

*Primary Examiner* — Eunhee Kim
(74) *Attorney, Agent, or Firm* — JCIPRNET

(57) ABSTRACT

Disclosed are a method and a system for correlating hydro-turbine governing system control parameters and oscillation characteristics, and the method includes the steps: calculating a eigenvalue, a zero point and a pole of a state matrix in a hydro-turbine governing system state space model, taking a pole which is the closest to the imaginary axis and has no zero point in a preset distance as a dominant eigenvalue; determining an oscillation characteristic region of the hydro-turbine governing system on the complex plane according to the dominant eigenvalue; obtaining a system control parameter stability domain according to a Hurwitz stability criterion; and calculating dominant eigenvalues corresponding to different control parameters, classifying the control parameters according to an oscillation characteristic region of a complex plane where the dominant eigenvalue is located, and dividing the oscillation characteristic region in a system control parameter stability domain.

8 Claims, 7 Drawing Sheets

(56) References Cited

OTHER PUBLICATIONS

Jiang C, Zhou J, Shi P, Huang W, Gan D. Ultra-low frequency oscillation analysis and robust fixed order control design. International Journal of Electrical Power & Energy Systems. Jan. 1, 2019;104:269-78. (Year: 2019).*

G. Tao-Rong, W. Guan-Hong and L. Tao, "Analysis and control on ultra low frequency oscillation at seeding end of UHVDC power system," 2014 International Conference on Power System Technology, Chengdu, China, 2014, pp. 832-837, doi: 10.1109/POWERCON.2014.6993885. (Year: 2014).*

Chaoshun Li, "Hydropower Generating Unit Control System Identification and Fault Diagnosis", Doctoral Dissertation, Jun. 2010, Hydraulic and Hydro-Power Engineering, Huazhong University of Science & Technology.

\* cited by examiner

METHOD AND SYSTEM FOR CORRELATING HYDRO-TURBINE GOVERNING SYSTEM CONTROL PARAMETERS AND OSCILLATION CHARACTERISTICS

CROSS-REFERENCE TO RELATED APPLICATION

This application claims the priority benefit of China application serial no. 202311620353.7, filed on Nov. 30, 2023. The entirety of the above-mentioned patent application is hereby incorporated by reference herein and made a part of this specification.

BACKGROUND

Technical Field

The disclosure belongs to the technical field of oscillation characteristic analysis of hydro-turbine governing systems, and more specifically, relates to a method and a system for correlating hydro-turbine governing system control parameters and oscillation characteristics.

Description of Related Art

In recent years, there are frequent occurrences of ultra-low frequency oscillations in hydropower-dominated systems, which reduce the power supply quality and long-distance power transfer capacity of the system, causing the frequency modulation unit speed regulator to shorten the service life of the speed regulator. In extreme cases, ultra-low frequency oscillation may cause large-scale operation of relay protection units, which may lead to significant power outages. The control parameters of hydro-turbine governing system significantly affect the adjustment characteristics of the hydropower system. Clarifying the system oscillation corresponding to different control parameters is the basis for ensuring the safe and stable operation of the system. The specific division of control parameters is crucial to the adjustment and optimization of control parameters. In the past, time domain simulation was adopted to determine the oscillation characteristics of the system corresponding to the system control parameters, which only constrained the adjusted performance without dividing the control parameters. Such conventional method has no contribution for operators to make fast adjustment and understand the oscillation characteristics of the system easily. Therefore, a method for correlating the control parameters and oscillation characteristics of the hydro-turbine governing system is provided, which intuitively reflects the adjustment oscillation characteristics of the system in the detailed division of the control parameter stability domain. The control parameter stability domain is divided into an ultra-low frequency oscillation risk region, an ultra-low frequency oscillation safe region, and so on, which helps operators quickly evaluate the impact of parameter settings on system oscillation and clarify parameter boundaries for risky operations, thereby ensuring safe operation of the unit.

SUMMARY

In view of the shortcomings of the existing technology, the purpose of the present disclosure is to provide a method and system for correlating control parameters and oscillation characteristics of a hydro-turbine governing system, aiming to solve the problem of the existing hydro-turbine governing system, which adopts the time domain simulation method to determine the oscillation characteristics of the system corresponding to the system control parameters and is only able to constrain the performance after adjustment. Besides, the conventional method does not divide the control parameters, it is not possible to intuitively obtain the relationship between the control parameters and system oscillation, and therefore it is difficult to quickly adjust the control parameters to ensure the safe operation of the water turbine unit.

In order to achieve the above purpose, on the one hand, the present disclosure provides a method for correlating control parameters and oscillation characteristics of a hydro-turbine governing system, which includes the following steps:

Step 1: calculating a eigenvalue, a zero point and a pole of a state matrix in a hydro-turbine governing system state space model, taking a pole which is the closest to the imaginary axis and has no zero point in a preset distance as a dominant eigenvalue;

Step 2: determining an oscillation characteristic region of the hydro-turbine governing system on the complex plane according to the dominant eigenvalue;

Step 3: converting the hydro-turbine governing system state space model into a transfer function model and extracting the characteristic equation of the transfer function model, obtaining a system control parameter stability domain according to the Hurwitz stability criterion;

Step 4: calculating dominant eigenvalues corresponding to different control parameters in the system control parameter stability domain, classifying the control parameters in the system control parameter stability domain according to the oscillation characteristic region of the hydro-turbine governing system of a complex plane where the dominant eigenvalue is located, and dividing the oscillation characteristic region of the hydro-turbine governing system in a system control parameter stability domain.

Further preferably, the method for dividing the oscillation characteristic region of the hydro-turbine governing system is: using the imaginary part of the dominant eigenvalue to determine the system oscillation frequency, and dividing the complex plane into a no-oscillation region, a 0 Hz to 0.01 Hz oscillation region, an ultra-low frequency oscillation region and an oscillation region above 0.1 Hz. The real part of the dominant eigenvalue is used to determine the system attenuation rate, and the ultra-low frequency oscillation region in the complex plane is divided into an ultra-low frequency oscillation safe region and an ultra-low frequency oscillation risk region; if the real part is less than or equal to −0.07, the ultra-low frequency oscillation region is divided into the ultra-low frequency oscillation safe region, otherwise the ultra-low frequency oscillation region is divided into the ultra-low frequency oscillation risk region.

F Further preferably, the hydro-turbine governing system state space model includes a speed regulator sub-model, a water diversion module sub-model, a water turbine sub-model and a generator sub-model.

Further preferably, the characteristic equation of the transfer function model is:

$$a_0\lambda^n + a_1\lambda^{n_o} + \ldots + a_{n_o-2}\lambda^2 + a_{n_o-1}\lambda + a_{n_o} = 0$$

In the equation, $\lambda$ is the eigenvalue, $a_i$ is the characteristic equation coefficient, $i=1, 2, \ldots, n_o$; $n_o$ is the system order, which is determined by the number of state variables in the state space model.

Further preferably, step 4 is specifically as follows: enumerating the control parameters in the control parameter stability domain according to a fixed step size, calculating the dominant eigenvalue corresponding to each of the control parameters, and classifying the control parameters in the system control parameter stability domain according to the oscillation characteristic region of the hydro-turbine governing system of the complex plane where the dominant eigenvalue is located, calculating the control parameters corresponding to the no-oscillation region, the OHz to 0.01 Hz oscillation region, the ultra-low frequency oscillation region and the oscillation region above 0.1 Hz, thereby realizing the mapping of the oscillation characteristic region of the hydro-turbine governing system to the control parameter stability domain plane.

On the other hand, the present disclosure provides a system for correlating control parameters and oscillation characteristics of a hydro-turbine governing system, including:

A building module of the hydro-turbine governing system state space model, configured to build the hydro-turbine governing system state space model;

A dominant eigenvalue acquisition module, configured to calculate a eigenvalue, a zero point and a pole of the state matrix in the hydro-turbine governing system state space model, and taking a pole which is the closest to the imaginary axis and has no zero point in a preset distance as a dominant eigenvalue;

A determining module of the oscillation characteristic region of the hydro-turbine governing system, configured to determine the oscillation characteristic region of the hydro-turbine governing system in the complex plane based on the dominant eigenvalue;

An acquisition module of the system control parameter stability domain, configured to convert the hydro-turbine governing system state space model into a transfer function model, extract the characteristic equation of the transfer function model, and obtain the system control parameter stability domain based on the Hurwitz stability criterion;

A system control parameter stability domain division module, configured to calculate dominant eigenvalues corresponding to different control parameters in the system control parameter stability domain, classify the control parameters in the system control parameter stability domain according to the oscillation characteristic region of the hydro-turbine governing system of the complex plane where the dominant eigenvalue is located, and divide the oscillation characteristic region of the hydro-turbine governing system in the system control parameter stability domain.

Further preferably, the method for dividing the oscillation characteristic region of the hydro-turbine governing system is: using the imaginary part of the dominant eigenvalue to determine the system oscillation frequency, and dividing the complex plane into a no-oscillation region, a 0 Hz to 0.01 Hz oscillation region, an ultra-low frequency oscillation region and an oscillation region above 0.1 Hz. The real part of the dominant eigenvalue is used to determine the system attenuation rate, and the ultra-low frequency oscillation region in the complex plane is divided into an ultra-low frequency oscillation safe region and an ultra-low frequency oscillation risk region; if the real part is less than or equal to −0.07, the ultra-low frequency oscillation region is divided into the ultra-low frequency oscillation safe region, otherwise the ultra-low frequency oscillation region is divided into the ultra-low frequency oscillation risk region.

Further preferably, the hydro-turbine governing system state space model includes a speed regulator sub-model, a water diversion module sub-model, a water turbine sub-model and a generator sub-model.

1 Further preferably, the characteristic equation of the transfer function model in the acquisition module of the system control parameter stability domain is:

$$a_0\lambda^n + a_1\lambda^{n_o} + \ldots + a_{n_o-2}\lambda^2 + a_{n_o-1}\lambda + a_{n_o} = 0$$

In the equation, A is the eigenvalue, $a_i$ is the characteristic equation coefficient, $i=1, 2, \ldots, n_o$; $n_o$ is the system order, which is determined by the number of state variables in the state space model.

Further preferably, the system control parameter stability domain division module specifically divides the system control parameter stability domain using the following method: enumerating the control parameters in the control parameter stability domain according to a fixed step size, calculating the dominant eigenvalue corresponding to each of the control parameters, and classifying the control parameters in the system control parameter stability domain according to the oscillation characteristic region of the hydro-turbine governing system of the complex plane where the dominant eigenvalue is located, calculating the control parameters corresponding to the no-oscillation region, the 0 Hz to 0.01 Hz oscillation region, the ultra-low frequency oscillation region and the oscillation region above 0.1 Hz, thereby realizing the mapping of the oscillation characteristic region of the hydro-turbine governing system to the control parameter stability domain plane.

In a third aspect, the present disclosure provides an electronic device, including: at least one memory for storing a program; at least one processor for executing the program stored in the memory. When the program stored in the memory is executed, the processor is configured to execute the method described in the first aspect or any preferred method further described in the first aspect.

In a fourth aspect, the present disclosure provides a computer-readable storage medium. The computer-readable storage medium stores a computer program. When the computer program is run on a processor, the processor executes the method described in the first aspect or any preferred method further described in the first aspect.

In a fifth aspect, the present disclosure provides a computer program product. When the computer program product is run on a processor, the processor executes the method described in the first aspect or any preferred method further described in the first aspect.

It can be understood that the advantageous effects of the above-mentioned second aspect to the fifth aspect may be derived from the relevant description in the above-mentioned first aspect, and will not be described again here.

DESCRIPTION OF THE EMBODIMENTS

Figure 1:
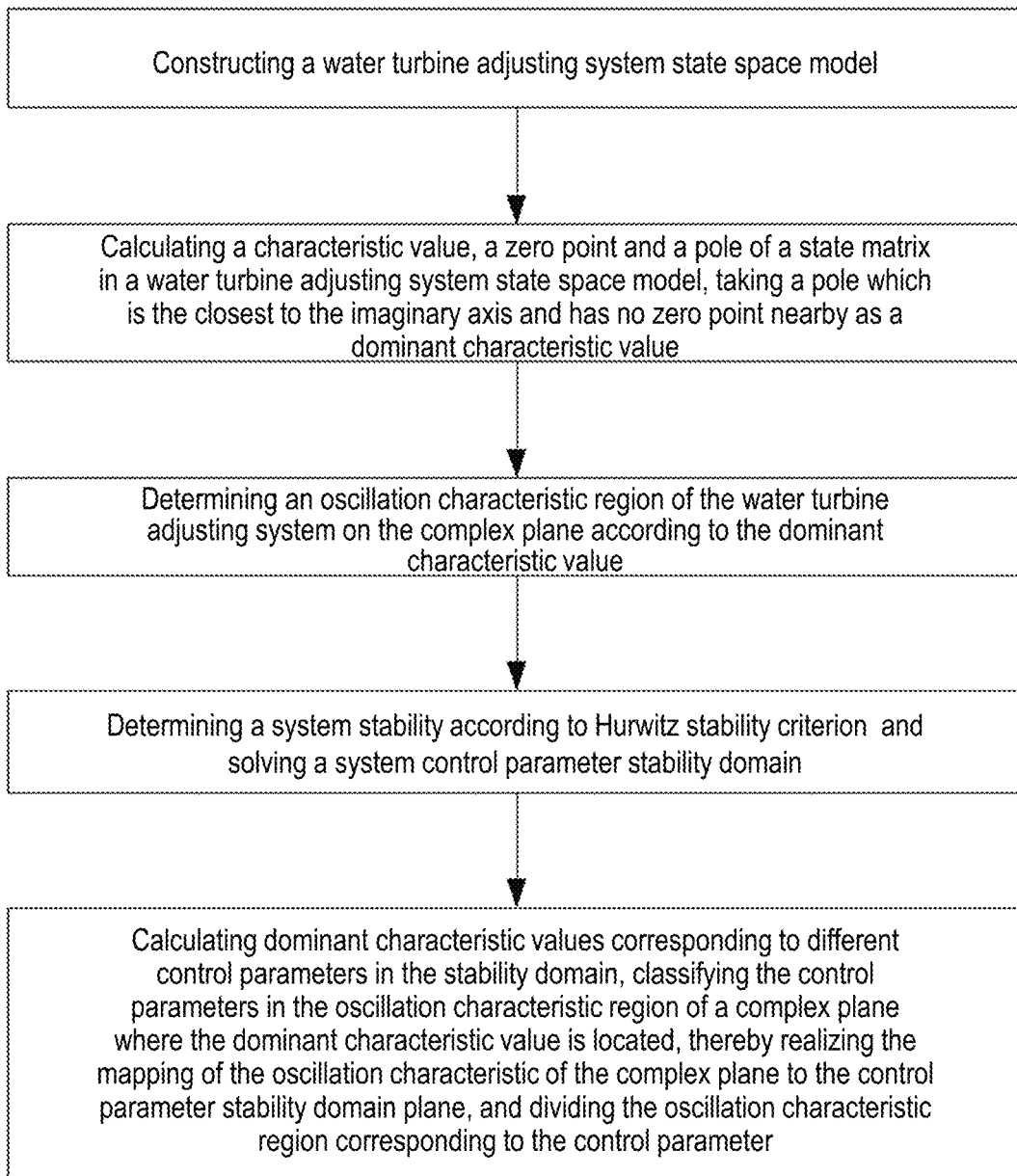
FIG. 1 is a flow chart of a method for correlating control parameters and oscillation characteristics of a hydro-turbine governing system provided in Embodiment 1 of the present disclosure.

In order to make the purpose, technical solutions and advantages of the present disclosure more clear, the present disclosure will be further described in detail below with reference to the accompanying drawings and embodiments. It should be understood that the specific embodiments described here are only used to explain the present disclosure and are not intended to limit the present disclosure.

The term "and/or" in the present disclosure describes an association relationship between related objects, indicating that there can be three relationships. For example, A and/or B can mean three conditions: A exists alone, A and B exist simultaneously, and B exists alone. The symbol "/" in the present disclosure indicates that the associated objects are in an "or" relationship, for example, A/B means A or B.

The terms "first", "second", etc. in the description and claims herein are used to distinguish different objects, rather than to describe a specific order of objects. For example, the first response message and the second response message are used to distinguish different response messages, but are not used to describe a specific sequence of response messages.

In the embodiments of the present disclosure, words such as "exemplary" or "for example" are used to represent examples, illustrations or explanations. Any embodiment or design described as "exemplary" or "such as" in the embodiments of the present application is not to be construed as preferred or advantageous over other embodiments or designs. Rather, use of the words "exemplary" or "such as" is intended to present the concept in a concrete manner.

In the description of the embodiments of the present disclosure, unless otherwise stated, the meaning of "a plurality of" refers to two or more, for example, a plurality of processing units refers to two or more processing units, etc.; a plurality of component refers to two or more components, etc.

The present disclosure provides a method and a system for correlating control parameters and oscillation characteristics of a hydro-turbine governing system. The adjustment oscillation characteristics of the system are intuitively reflected in the detailed division of the control parameter stability domain. The control parameter stability domain is divided into an ultra-low frequency oscillation risk region and an ultra-low frequency oscillation safe region, etc., which helps operators quickly evaluate the impact of parameter settings on system oscillation and clarify parameter boundaries for risky operations, thereby facilitating safe operation of the unit.

Embodiment 1

This embodiment takes a certain hydropower station as a research counterpart, and the specific hydro-turbine governing system parameters are shown in Table 1.

TABLE 1

| Number of unit | Component | Parameter |
|---|---|---|
| Water system | Pressure pipe | $T_{r1} = 0.5567272$ s, $h_{w1} = 1.5694132$, $a_1 = 0$ |
| | Draft pipe | $T_{r2} = 0.2750000$ s, $h_{w2} = 0.9907912$, $a_2 = 0$ |
| | Surge well | $T_{w5} = 1.9395$ s, $r_5 = 0.017$, $L_5 = 1031.8$m, $A_5 = 289.3$ m$^2$ |
| | Tailrace tunnel | $T_{r3} = 2.1440000$ s, $h_{w3} = 0.4452855$, $a_3 = 0.0006029$ $H_r = 202$ m, $Q_r = 538.8$m$^3$/s, $P_r = 1035$ MW |
| Water turbine | Rated working condition | Six parameters of hydro-turbine $[e_y, e_h, e_x, e_{qy}, e_{qh}, e_{qx}] =$ $[1, 1.5, -1, 1, 0.5, 0]$ |
| Speed regulator 144530usf | | $K_D = 0.1$, $T_d = 0.01$, $b_p = 0.02$ |
| Generator | / | $T_a = 12.07$, $e_g = 0.176$, $T_a = 12.07$, $e_g = 0.176$ |

Figure 2:
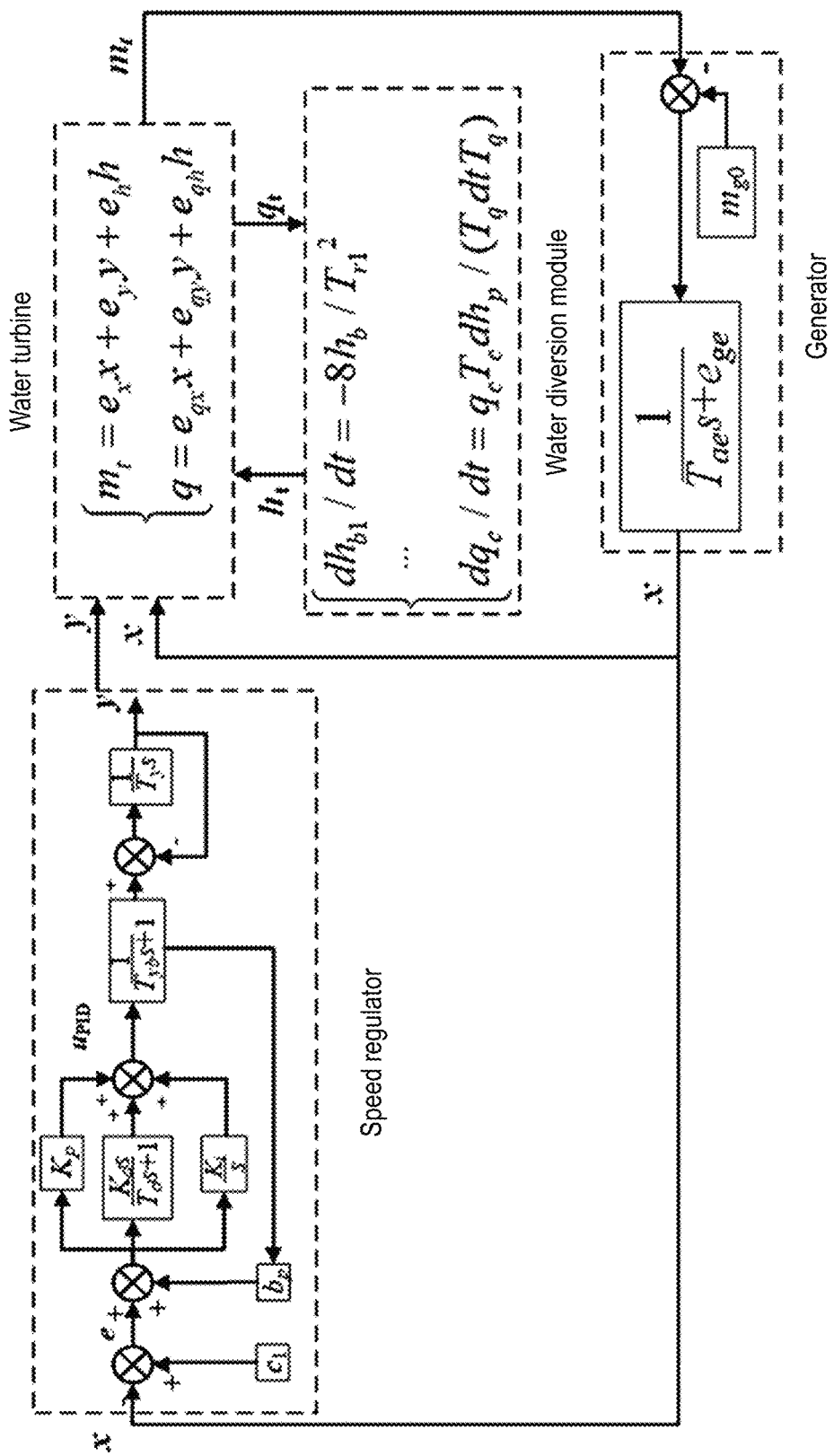
FIG. 2 is a schematic view of a hydro-turbine governing system state space model provided in Embodiment 1 of the present disclosure.

As shown in FIG. 1, the present disclosure provides a method for correlating control parameters and oscillation characteristics of a hydro-turbine governing system, which includes the following steps:

Step 1: As shown in FIG. 2, a hydro-turbine governing system state space model is established, wherein the hydro-turbine governing system state space model includes four modules: a speed regulator, a water diversion module, a water turbine and a generator. The state space model shows the relationship between the state variables of the hydro-turbine governing system and the system matrix composed of the parameters of each module, thereby determining the system state matrix.

Specifically: the hydro-turbine governing system sub-model includes four modules: a PID speed regulator, a water diversion module, a water turbine and a generator; the PID speed regulator sub-model may be expressed as:

$$\begin{cases} \dfrac{dx_D}{dt} = -\dfrac{K_D}{T_D}\dfrac{dx}{dt} - \dfrac{1}{T_D}x_D \\ x_P = K_P(c_1 - x - b_P y_1) \\ \dfrac{dx_1}{dt} = K_I c_1 - K_I x - K_I b_P y_1 \\ \dfrac{dy_1}{dt} = \dfrac{1}{T_{y1}}(x_P + x_I + x_D - y_1) \\ \dfrac{dy}{dt} = \dfrac{1}{T_y}(y_1 - y) \end{cases} \quad (1)$$

In the formula, $K_p$ is a proportional coefficient, $K_I$ is an integral coefficient, $K_D$ is a differential coefficient, $T_D$ is a differential time constant, $b_p$ is a permanent slip coefficient, $x_p$, $x_I$ and $x_D$ are proportional signal, integral signal, and differential signal respectively, x is a relative value of a unit rotation speed deviation, $c_1$ is a relative value of a setting rotation speed, $y_1$ and y are relative values of an auxiliary relay output signal and a guide vane opening deviation respectively; $T_{y1}$ is a reaction time constant of an auxiliary relay, and $T_y$ is a reaction time constant of a main relay.

The water diversion module sub-model may be expressed as:

$$\begin{cases} \dfrac{dh_{b1}}{dt} = -\dfrac{8}{T_{r1}^2}h_b \\ \dfrac{dh_b}{dt} = h_{b1} - \dfrac{8h_{w1}}{T_r}q_t \\ \dfrac{dh_{x1}}{dt} = \dfrac{8}{T_{r2}^2}h_p - \dfrac{8}{T_{r2}^2}h_x \\ \dfrac{dh_x}{dt} = h_{x1} + \dfrac{8h_{w2}}{T_{r2}}q_t \\ \dfrac{dh_{21}}{dt} = \dfrac{8}{T_{r2}^2}q_t - \dfrac{8}{T_{r2}^2}q_2 \\ \dfrac{dq_2}{dt} = q_{21} - \dfrac{2}{h_w T_{r2}} \\ \dfrac{dh_{p1}}{dt} = -\dfrac{8}{T_{r3}^2}h_p + \dfrac{16h_{w3}a_3}{T_{r3}^2}q_3 \\ \dfrac{dh_p}{dt} = -\dfrac{4a_3}{T_{r3}}h_p + h_{p1} + \dfrac{8h_{w3}}{T_{r3}}q_3 \\ \dfrac{dq_c}{dt} = \dfrac{T_c}{T_q}\dfrac{dh_p}{dt} - \dfrac{1}{T_q}q_c \end{cases} \quad (2)$$

In the formula, $h_{b1}$, $h_{x1}$, $h_{p1}$, and $q_{21}$ are intermediate state variables introduced to calculate the second-order approximate elastic water hammer, $T_{r1}$, $T_{r2}$, and $T_{r3}$ are the water hammer phases of the pressure pipe, draft pipe and tailrace tunnel respectively; $h_{w1}$, $h_{w2}$ and $h_{w3}$ are the pipe characteristic coefficients of the pressure pipe, draft pipe and tailrace tunnel respectively; $h_{wb}$ is the relative value of the water head deviation at the terminal section of the pressure pipe, $h_x$ is the relative value of the deviation of the draft pipe inlet head, $h_p$ is the relative value of the deviation of the draft pipe outlet head; $q_r$ is the relative value of the deviation of the flow rate of the water turbine; $q_2$ is the relative value of deviation of the flow rate of the draft pipe outlet, $q_c$ is the relative value of the deviation of the flow rate of the surge well; $T_q$ is the surge well flow time constant; $T_c$ is the surge well time constant; $h_p$ is the relative value of the deviation of tailrace tunnel inlet flow rate; and $a_3$ is the pipe loss constant of the tailrace tunnel.

The water turbine sub-model may be expressed as:

$$\begin{cases} q_t = e_{qx}x + e_{qy}y + e_{qh}h_t \\ m_t = e_x x + e_y y + e_h h_t \end{cases} \quad (3)$$

In the formula, $m_t$ is the relative value of the deviation of the water turbine torque; $q_t$ is the relative value of the deviation of the flow rate of the water turbine; x is the relative value of the deviation of the rotation speed; $h_t$ is the relative value of the deviation of the water turbine head; y is the relative value of the deviation of the guide vane opening; $e_y$ is the transfer coefficient of water turbine torque to guide vane opening; $e_x$ is the transfer coefficient of water turbine torque to rotation speed; $e_h$ is the transfer coefficient of water turbine torque to working head; $e_{qy}$ is the transfer coefficient of the water turbine flow rate to guide vane opening; $e_{qx}$ is the transfer coefficient of water turbine flow rate to rotation speed; $e_{qh}$ is the transfer coefficient of water turbine flow rate to working head.

The generator and the load sub-model may be expressed as:

$$T_a \dfrac{dx}{dt} = m_t - m_{g0} - e_g x \quad (4)$$

In the formula, $T_a$ is the inertia time constant of the unit, $m_T$ is the relative value of the deviation of the main power torque of the unit, $m_{g0}$ is the relative value of the deviation of the load torque, and $e_g$ is the generator load self-adjustment coefficient.

Combined with the above system, the state space model may be expressed as:

$$\begin{cases} \dot{X} = A_{14,14}X_{14,1} + B_{14,2}U_{2,1} \\ Y = C_{1,14}X_{14,1} + D_{1,2}U_{2,1} \end{cases} \quad (5)$$

Wherein $X_{14,1} = [x, y_1, y, x_I, x_D, h_{x1}, h_x, q_{21}, q_2, h_{b1}, h_b, h_{p1}, h_p, q_c]^T$, $U_{2,1} = [c, m_g]^T$, $A_{14,14} = \begin{bmatrix} a_{1,1} & \cdots & a_{1,14} \\ \vdots & \ddots & \vdots \\ a_{14,1} & \cdots & a_{14,14} \end{bmatrix}, B_{14,2} = \begin{bmatrix} b_{1,1} & b_{2,1} \\ \vdots & \vdots \\ b_{14,1} & b_{14,2} \end{bmatrix}$, $C_{1,14} = [c_{1,1} \cdots c_{1,14}], D = 0,$ Wherein $a_{1,1}=-e_r/T_a, a_{1,3}=e_y/T_a, a_{1,7}=-e_r/T_a,$ $a_{1,11}=e_r/T_a, a_{2,1}=-K_p/T_y, b_{1,2}=-1/T_a,$ $a_{2,2}=-(1+K_p b_p)/T_{y1}, a_{2,4}=1/T_{y1}, a_{2,5}=1/T_{y1}, b_{2,1}=K_p/T_y,$ $a_{3,2}=1/T_y, a_{3,3}=-1/T_y, a_{4,1}=-K_i, a_{4,2}=-K_i b_p, b_{4,1}=K_i,$ $a_{5,1}=(k_d e_n)/T_d T_a, a_{5,3}=-(K_d e_y)/T_d T_a,$ $a_{5,5}=-1/T_d, a_{5,7}=(K_d e_h)/(T_d T_a),$ $a_{5,11}=-(K_d e_h)/(T_d T_a), b_{5,2}=K_d/(T_d T_a), a_{6,7}=-8/(T_{r2}^2), a_{6,13}=8/(T_{r2}^2),$ $a_{7,1}=8h_{w2}e_{qx}/T_{r2}, a_{7,3}=8h_{w2}e_{qy}/T_{r2}, a_{7,6}=1, a_{7,7}=-8h_{w2}e_{qh}/T_{r2}, a_{7,11}=8h_{w2}e_{qh}/T_{r2},$ $a_{8,1}=8e_{qx}/T_{r2}^2, a_{8,3}=8e_{qy}/T_{r2}^2, a_{8,7}=-8e_{qh}/T_{r2}^2, a_{8,9}=-8/T_{r2}^2, a_{8,11}=8e_{qh}/T_{r2}^2,$ $a_{9,8}=1, a_{9,13}=-2/(h_{w2}T_{r2}), a_{10,11}=-8/(T_{r1}^2),$ $a_{11,1}=-8h_{w1}e_{qx}/T_{r1}, a_{11,3}=-8h_{w1}e_{qy}/T_{r1},$ $a_{11,7}=8h_{w1}e_{qh}/T_{r1}, a_{11,10}=1, a_{11,11}=-8h_{w1}e_{qh}/T_{r1},$ $a_{12,9}=16h_{w3}a_3/(T_{r3}^2), a_{12,13}=-8/T_{r3}^2, a_{12,14}=-16h_{w3}a_3/(T_{r3}^2),$ $a_{13,9}=8h_{w3}/T_{r3}, a_{13,12}=1, a_{13,13}=-4a_3/T_{r3}, a_{13,14}=-8h_{w3}/T_{r3},$ $a_{14,9}=8h_{w3}T_c/(T_{r3}T_q), a_{14,12}=T_c/T_q,$ $a_{14,13}=-4a_3T_c/(T_{r3}T_q), a_{14,14}=-(8h_{w3}T_c+T_{r3})/(T_{r3}T_q),$ In the formula, $\dot{X}$ is the state variable differential vector; Y is the output quantity; $A_{14,14}$ is the state matrix; $X_{14,1}$ is the state variable vector; $B_{14,2}$ is the control matrix; $U_{2,1}$ is the control vector; $C_{1,14}$ is the state output matrix; $D_{1,2}$ is the control output matrix; other elements not given above in $A_{14,14}$ are all 0; other elements not given above in $B_{14,2}$ are all 0.

Figure 3:
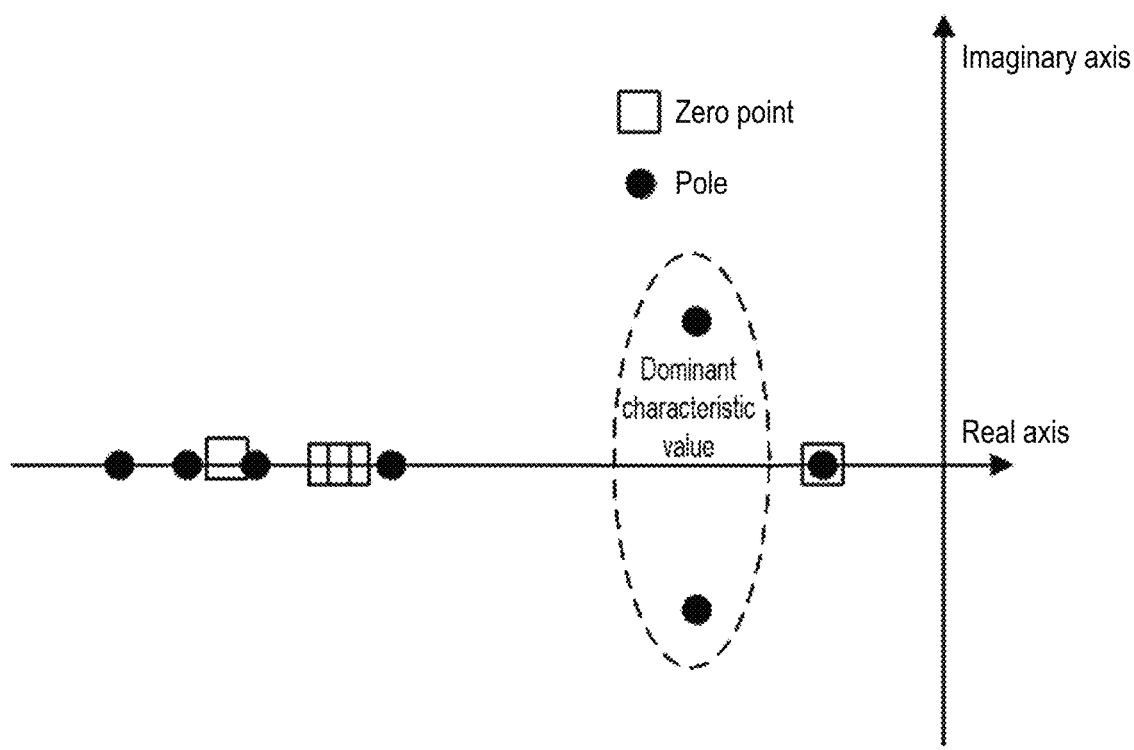
FIG. 3 is a schematic view for determining a dominant eigenvalue of the hydro-turbine governing system provided in Embodiment 1 of the present disclosure.

Step 2: As shown in FIG. 3, to determine the dominant eigenvalue of the system in step 2, first the eigenvalue of the state matrix $A_{14,14}$ in the state space model is calculated, and the system zeros and poles are calculated as well; the pole that is the closest to the imaginary axis and has no zero point nearby is the dominant pole, which is also the dominant eigenvalue $$\lambda_m = \sigma_m \pm \omega_m j.$$

Figure 4:
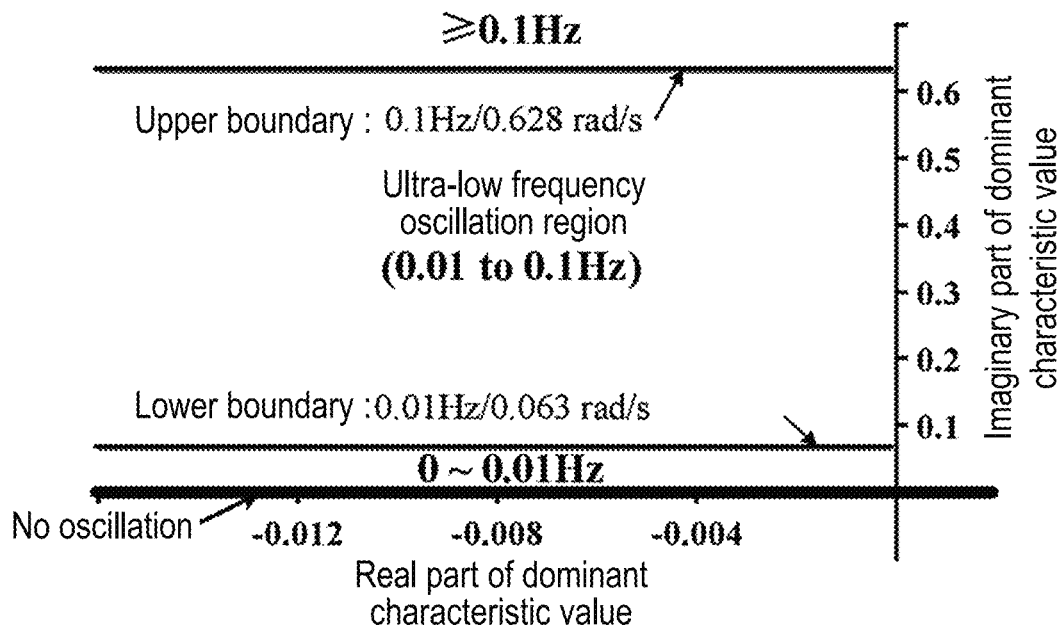
FIG. 4 is a schematic view of different oscillation mode regions of the hydro-turbine governing system provided in Embodiment 1 of the present disclosure.
Figure 5:
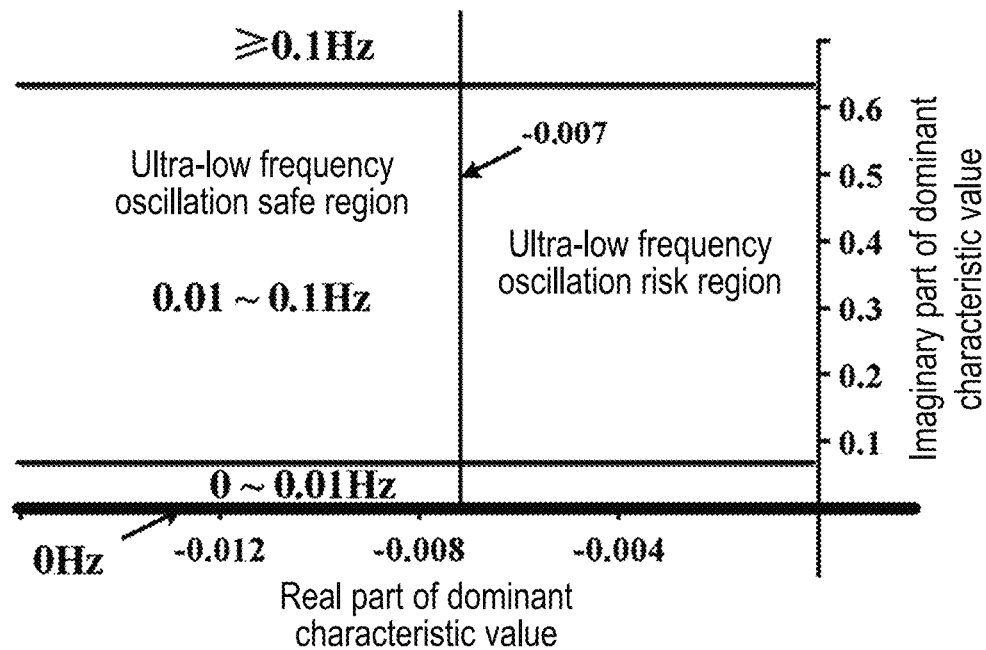
FIG. 5 is a schematic view of ultra-low frequency oscillation risks and safe regions provided in Embodiment 1 of the present disclosure.

Step 3: The oscillation characteristic region of the hydro-turbine governing system in the complex plane is determined based on the dominant eigenvalue. In the complex plane, the system oscillation angular frequency is determined based on the imaginary part $\omega$ of the dominant eigenvalue, and the system attenuation rate is determined based on the real part $\sigma$; the oscillation frequency conversion relationship between the system oscillation angular frequency and the system is $f = 2\pi\omega$; the complex plane is divided into no-oscillation region (f=0), a 0 Hz to 0.01 Hz oscillation region (f∈(0~0.01) Hz), an ultra-low frequency oscillation region (f∈[0.01~0.1] Hz) and an oscillation region above 0.1 Hz (f>0.1 Hz) according to the system oscillation frequency, as shown in FIG. 4. On basis of the above, the division is made to divide the ultra-low frequency oscillation safe region and the ultra-low frequency oscillation risk region according to the magnitude $\sigma$ of the system attenuation factor. In the oscillation mode region, on the condition that $\sigma_m \leq -0.07$, the ultra-low frequency oscillation region is the system oscillation safe region, on the condition that $\sigma > -0.07$, the ultra-low frequency oscillation region is the system oscillation risk region, as shown in FIG. 5.

It should be pointed out that step three determines the oscillation characteristic region of the hydro-turbine governing system in the complex plane based on the dominant eigenvalue. The purpose of the following steps four and five is to obtain the system control parameter stability domain (a plane constructed with the horizontal axis being $K_p$ and the vertical axis being $K_I$). Further, the system control parameter stability domain is divided the into ultra-low frequency oscillation safe region, the non-ultra-low frequency oscillation region and the ultra-low frequency oscillation risk region. It can be seen that the system control parameter stability domain is consistently divided as the complex plane constructed by the dominant eigenvalue, and the difference is that the horizontal axis of the complex plane is the real part of the dominant eigenvalue, and the vertical axis is the imaginary part of the dominant eigenvalue; while the horizontal axis of the system control parameter stability domain is $K_p$, and the vertical axis thereof is $K_I$. In the related field, a skilled person may intuitively obtain the oscillation characteristics of the hydro-turbine governing system by adjusting $K_p$ and $K_I$; the following describes steps four and five in detail.

Step 4: The system control parameter stability domain is determined. The stability domain of the system control parameters is solved by using the Hurwitz stability criterion to determine the system stability; the specific steps are as follows:

Step 1: The system state space model is converted into a transfer function model:

$$sys(A,B,C,D) \rightarrow tf(a_0, \ldots a_{14}, b_0, \ldots b_{14}) \quad (6)$$

Step 2: The characteristic equation of the transfer function model is extracted:

$$a_0\lambda^n + a_1\lambda^{n_o-1} + \ldots + a_{n_o-2}\lambda^2 + a_{n_o-1}\lambda + a_{n_o} = 0 \quad (7)$$

In the formula, $\lambda$ is the eigenvalue, $a_i(i=1, 2, \ldots, n_0)$ is the characteristic equation coefficient, $n_o$ is the system order $n_o = 14$.

Figure 6:
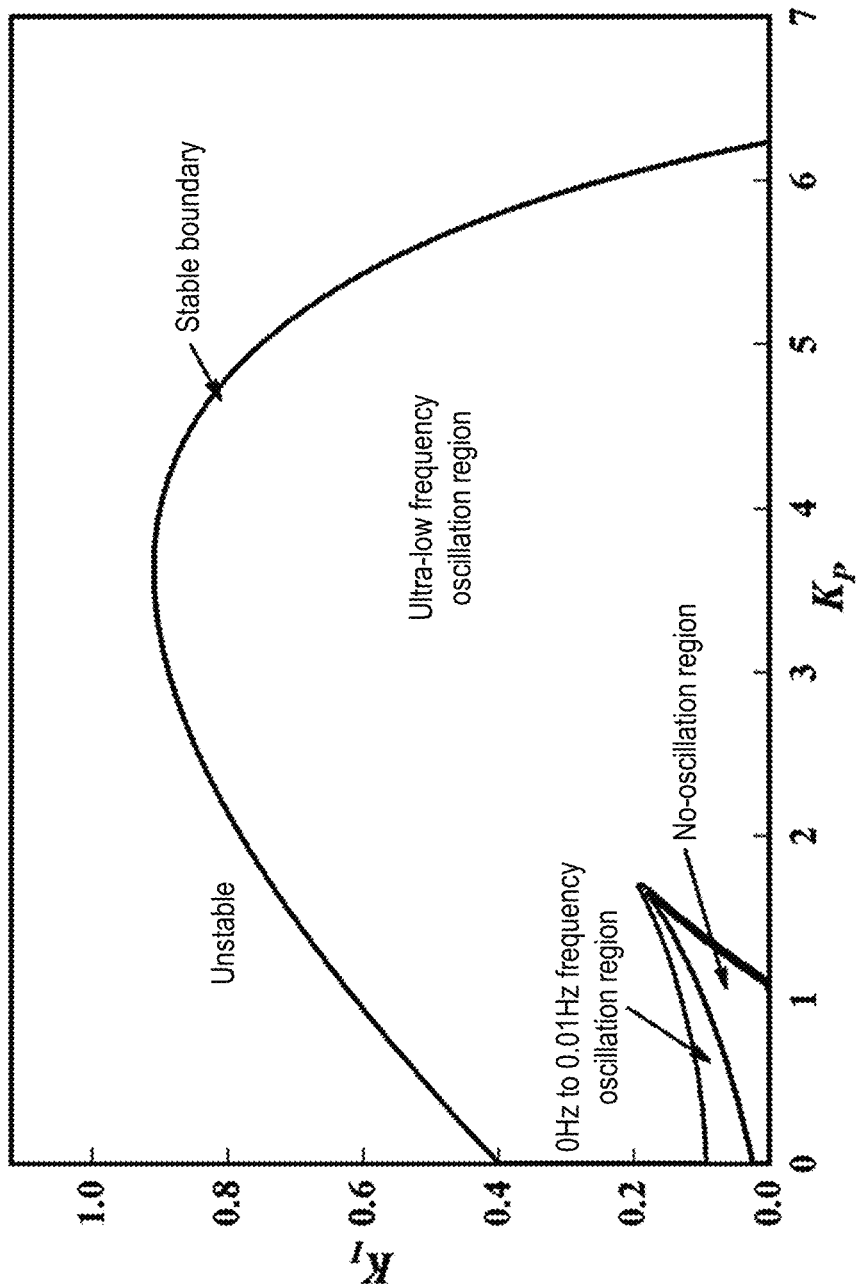
FIG. 6 shows different oscillation mode regions of control parameters provided in Embodiment 1 of the present disclosure.

Step 3: The control parameter stability domain is solved:

According to the Hurwitz stability criterion, the necessary conditions for the stability of the system are: under the critical PI condition, $a_i(K_p, K_I) > 0, \Delta_j(K_p, K_I) > 0$, $j=1, 2, \ldots, n_o-2$; the PI critical stability parameter of $\Delta_{n_o-1}(K_p, K_I) = 0$ is solved; the inside of this curve is the system control parameter stability domain, and the PI parameter stability domain is as shown in FIG. 6.

$$\Delta_1 = |a_1|, \Delta_2 = \begin{vmatrix} a_1 & 1 \\ a_3 & a_2 \end{vmatrix}, \ldots \ldots , \quad (8)$$

$$\Delta_j(K_P, K_I) = \begin{vmatrix} a_1 & 1 & 0 & \ldots & 0 \\ a_3 & a_2 & a_1 & \ldots & 0 \\ a_5 & a_4 & a_3 & \ldots & 0 \\ \vdots & \vdots & \vdots & \ddots & \vdots \\ a_{2m-1} & a_{2m-2} & a_{2m-3} & \ldots & a_m \end{vmatrix} j = 1,$$

$$2, \ldots, n_o - 1, i = 1, 2, \ldots, n_o$$

In the formula, $a_i(K_p, K_I)$ is the coefficient of the characteristic equation, which is related to the control parameter; $\Delta_j(K_p, K_I)$ is the j-th order coefficient determinant; $n_o$ is the system order.

Step 5: The oscillation characteristic region of the control parameter stability domain is determined; the dominant eigenvalues corresponding to different control parameters in the stability domain are calculated, the control parameters are classified according to the oscillation characteristic region of the complex plane where the dominant eigenvalue is located, and the oscillation characteristics of the complex plane are mapped to control parameter stability domain plane, thereby dividing the oscillation characteristic region corresponding to the control parameters.

Figure 7:
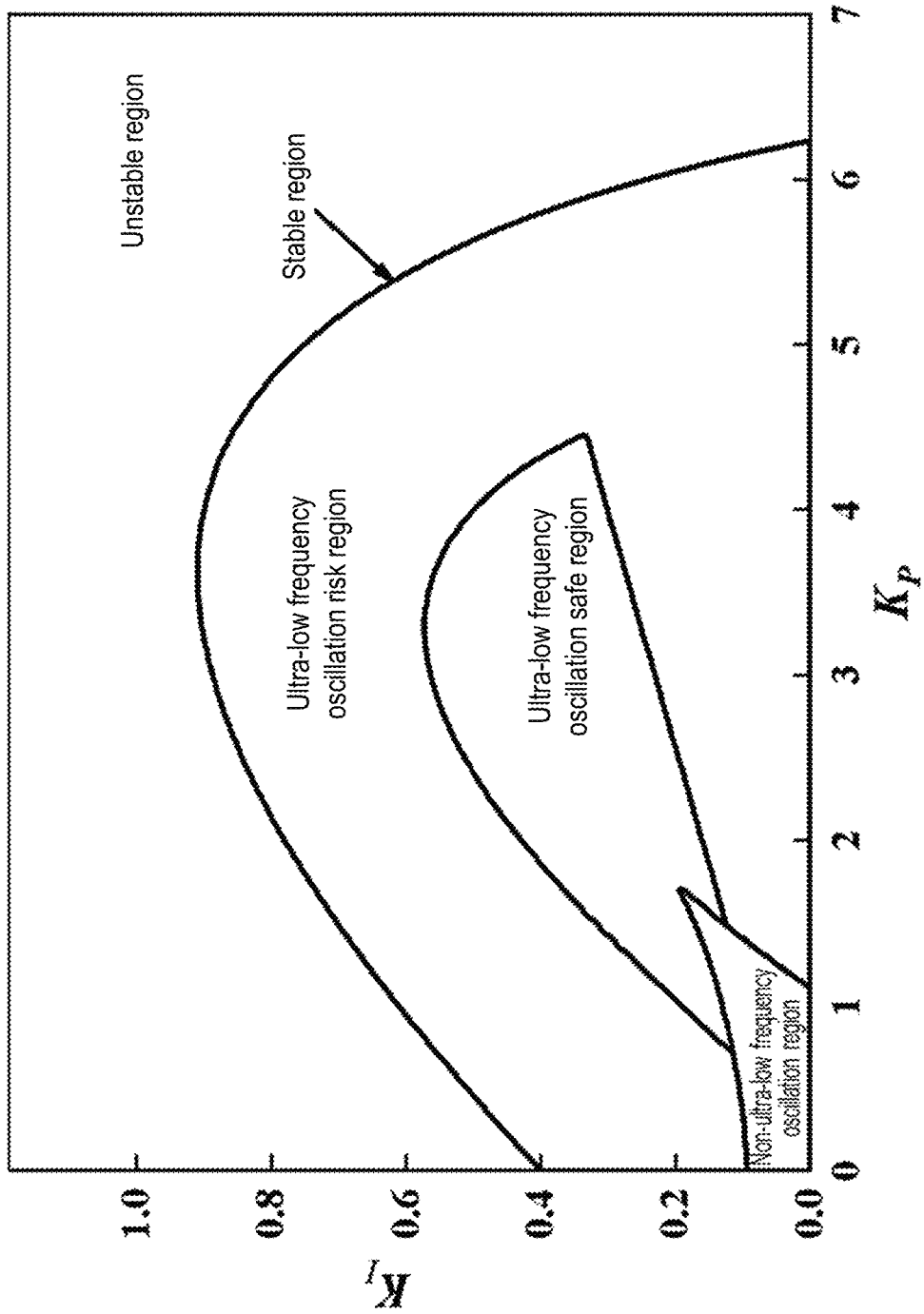
FIG. 7 is a safe region and a risk region for different oscillations of control parameters provided in Embodiment 1 of the present disclosure.

Further preferably, in step five, the control parameters are divided according to the system oscillation characteristic region where the dominant eigenvalue is located according to the different control parameters. The control parameters in the stability domain are enumerated according to a fixed step size, the corresponding dominant eigenvalue is calculated, and the control parameters are classified according to the oscillation characteristic region of the complex plane where the dominant eigenvalue is located. The control parameters corresponding to the no-oscillation region, the 0 Hz to 0.01 Hz oscillation region, the ultra-low frequency oscillation region and the oscillation region above 0.1 Hz are calculated. The division results of the control parameters are shown in FIG. 7. The mapping of complex plane oscillation characteristics to the control parameter stability domain plane is realized.

Embodiment 2

Figure 8:
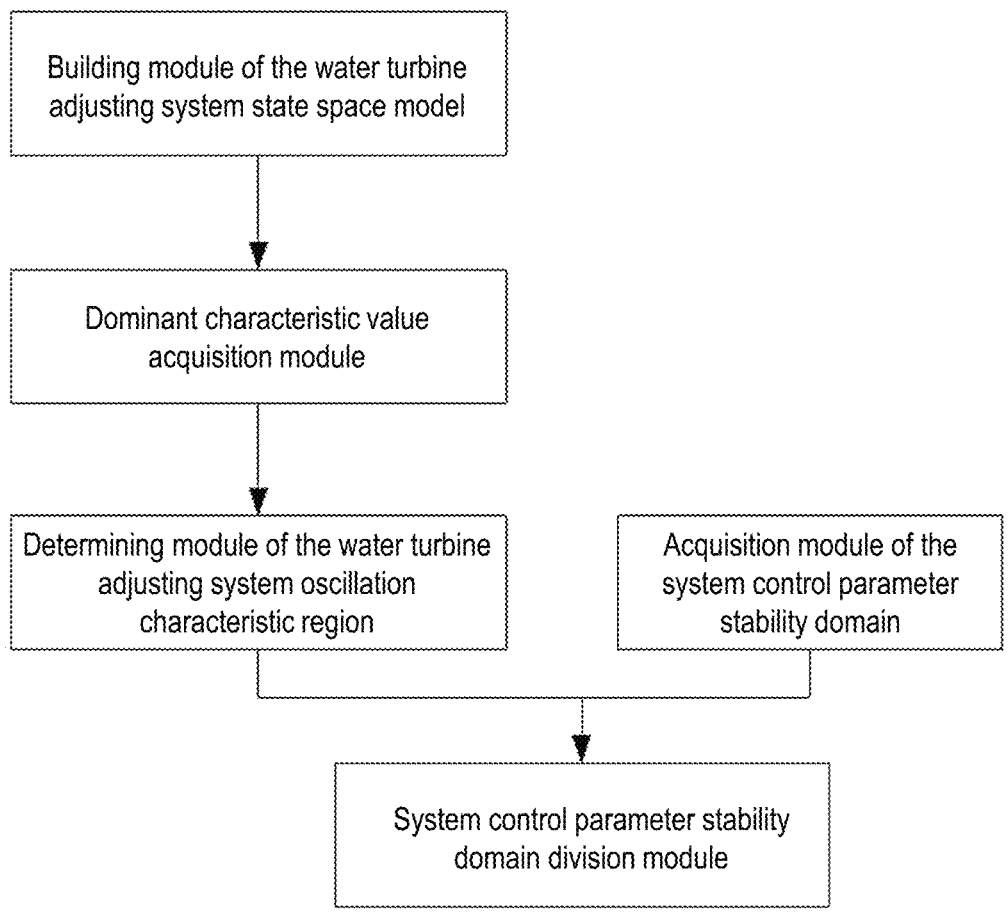
FIG. 8 is a schematic view of a system for correlating control parameters and oscillation characteristics of a hydro-turbine governing system provided in Embodiment 2 of the present disclosure.

As shown in FIG. 8, the present disclosure provides a system for correlating control parameters and oscillation characteristics of a hydro-turbine governing system, including:

A building module of the hydro-turbine governing system state space model, configured to build the hydro-turbine governing system state space model;

A dominant eigenvalue acquisition module, configured to calculate a eigenvalue, a zero point and a pole of the state matrix in the hydro-turbine governing system state space model, and taking a pole which is the closest to the imaginary axis and has no zero point in a preset distance as a dominant eigenvalue;

A determining module of the hydro-turbine governing system oscillation characteristic region, configured to determine the oscillation characteristic region of the hydro-turbine governing system in the complex plane based on the dominant eigenvalue;

An acquisition module of the system control parameter stability domain, configured to convert the hydro-turbine governing system state space model into a transfer function model, extract the characteristic equation of the transfer function model, and obtain the system control parameter stability domain based on the Hurwitz stability criterion;

A system control parameter stability domain division module, configured to calculate dominant eigenvalues corresponding to different control parameters in the system control parameter stability domain, classify the control parameters in the system control parameter stability domain according to an oscillation characteristic region of the hydro-turbine governing system of a complex plane where the dominant eigenvalue is located, and divide the oscillation characteristic region of the hydro-turbine governing system in a system control parameter stability domain.

Further preferably, the method for dividing the oscillation characteristic region of the hydro-turbine governing system is: using the imaginary part of the dominant eigenvalue to determine the system oscillation frequency, and dividing the complex plane into a no-oscillation region, a 0 Hz to 0.01 Hz oscillation region, an ultra-low frequency oscillation region and an oscillation region above 0.1 Hz. The real part of the dominant eigenvalue is used to determine the system attenuation rate, and the ultra-low frequency oscillation region in the complex plane is divided into an ultra-low frequency oscillation safe region and an ultra-low frequency oscillation risk region; if the real part is less than or equal to −0.07, the ultra-low frequency oscillation region is divided into the ultra-low frequency oscillation safe region, otherwise the ultra-low frequency oscillation region is divided into the ultra-low frequency oscillation risk region.

Further preferably, the hydro-turbine governing system state space model includes a speed regulator sub-model, a water diversion module sub-model, a water turbine sub-model and a generator sub-model.

Further preferably, the characteristic equation of the transfer function model is:

$$a_0 \lambda^n + a_1 \lambda^{n_o-1} + \ldots + a_{n_o-2} \lambda^2 + a_{n_o-1} \lambda + a_{n_o} = 0 \quad (7)$$

In the equation, $\lambda$ is the eigenvalue, $a_i$ is the characteristic equation coefficient, $i=1, 2, \ldots, n_o$; $n_o$ is the system order, which is determined by the number of state variables in the state space model.

Further preferably, the system control parameter stability domain division module specifically divides the system control parameter stability domain using the following method: enumerating the control parameters in the control parameter stability domain according to a fixed step size, calculating the dominant eigenvalue corresponding to each of the control parameters, and classifying the control parameters in the system control parameter stability domain according to the oscillation characteristic region of the hydro-turbine governing system of the complex plane where the dominant eigenvalue is located, calculating the control parameters corresponding to the no-oscillation region, the 0 Hz to 0.01 Hz oscillation region, the ultra-low frequency oscillation region and the oscillation region above 0.1 Hz, thereby realizing the mapping of the oscillation characteristic region of the hydro-turbine governing system to the control parameter stability domain plane.

In practical applications, it is necessary to set appropriate control parameters (Kp and Ki) in the turbine speed regulator to meet the oscillation characteristic requirements of the turbine system (the oscillation characteristic region is generally divided into no oscillation region, ultra-low frequency oscillation region and 0 Hz to 0.01 Hz oscillation region). Based on the oscillation characteristic region of the hydro-turbine governing system divided in the control parameter stability domain obtained by this application, any operator or intelligent equipment such as a computer can control the control parameters of the governor in the hydro-turbine governing system. In a safe governing region of the control parameters of ultra-low frequency oscillation, randomly selects a set of control parameters as the parameters of the controller, so that the hydraulic turbine unit operates in the safe oscillation region.

To sum up, compared with the existing technology, the present disclosure has the following advantages:

The disclosure provides a method and a system for correlating control parameters and oscillation characteristics of a hydro-turbine governing system. The method and the system establishes detailed divisions of control parameters, not only that it is possible to distinguish whether the control parameters are able to stabilize the system, but also distinguish whether the parameters cause the system to oscillate, and what frequency band of oscillation is generated, as well as whether the generated oscillation decays quickly. In this way, the influence of evaluation parameter setting of operators on system oscillation is simplified.

Through the division of control parameters, the safe region for adjustment of the control parameters of ultra-low frequency oscillation may be specifically determined, thereby clarifying the parameter boundaries of risky operations, and helping operators adjust control parameters, thus facilitating the safe operation of the unit.

It should be understood that the above system is used to execute the method in the above embodiment. The system may include: at least one memory for storing a least one module and at least one processor for executing the module stored in the memory. When the module stored in the memory is executed, the processor is used to execute the method described in the above embodiments. The modules include the modules described above, and will not be described again here. The corresponding program modules in the system have implementation principles and technical effects similar to those described in the above method. The working process of the system may be derived from the corresponding ones in the above method. The process will not be described again here.

Based on the methods in the above embodiments, embodiments of the present disclosure provide an electronic device. The device may include: at least one memory for storing a program and at least one processor for executing the program stored in the memory. When the program stored in the memory is executed, the processor is used to execute the method described in the above embodiments.

Based on the methods in the above embodiments, embodiments of the present disclosure provide a computer-readable storage medium. The computer-readable storage medium stores a computer program. When the computer program is run on a processor, the processor executes the method in the above embodiments.

Based on the methods in the above embodiments, embodiments of the present disclosure provide a computer program product. When the computer program product is run on a processor, the processor executes the method in the above embodiments.

It can be understood that the processor in the embodiments of the present disclosure may be a central processing unit (CPU), or other general-purpose processors, a digital signal processor (DSP), an application specific integrated circuit (ASIC), a field programmable gate array (FPGA) or other programmable logic devices, transistor logic devices, hardware components or any combination of the above. A general-purpose processor may be a microprocessor or any conventional processor.

The steps of the method in the embodiments of the present disclosure may be implemented by hardware or by a processor executing software instructions. Software instructions may be composed of corresponding software modules. The software modules may be stored in a random access memory (RAM), a flash memory, a read-only memory (ROM), a programmable rom (PROM), an erasable PROM (EPROM), an electrically EPROM (EEPROM), a register, a hard disk, a mobile hard disk, a CD-ROM or other forms of storage media known to persons skilled in the art. An exemplary storage medium is coupled to the processor such that the processor is able to read information from the storage medium and write information to the storage medium. Of course, the storage medium may also be an integral part of the processor. The processor and the storage media may be located in an ASIC.

The above embodiments may be implemented in whole or in part by software, hardware, firmware, or any combination thereof. When the above embodiments are implemented using software, they may be implemented in whole or in part in the form of a computer program product. The computer program product includes one or more computer instructions. When the computer program instructions are loaded and executed on a computer, all or part of the processes or functions described in the embodiments of the present disclosure are generated. The computer may be a general-purpose computer, a specific-purpose computer, a computer network, or other programmable device. The computer instructions may be stored in or transmitted over the computer-readable storage medium. The computer instructions may be transmitted from one website, computer, server or data center to another website, computer, server or data center in a wired manner (such as coaxial cable, optical fiber, digital subscriber line (DSL)) or a wireless manner (such as infrared, wireless, microwave, etc.). The computer-readable storage medium may be any available medium that can be accessed by a computer or a data storage device such as a server, data center, etc. that contains one or more available media integrated. The available media may be magnetic media (e.g., floppy disk, hard disk, magnetic tape), optical media (e.g., DVD), or semiconductor media (e.g., solid state disk (SSD)), etc.

It can be understood that the various numerical numbers involved in the embodiments of the present disclosure are only for convenience of description and are not used to limit the scope of the embodiments of the present disclosure.

Generally speaking, compared with the related art, the above technical solution conceived by the present disclosure has the following advantageous effects.

The present disclosure provides a method and a system for correlating control parameters and oscillation characteristics of a hydro-turbine governing system. First, the oscillation characteristic region of the hydro-turbine governing system in the complex plane is determined based on the dominant eigenvalue; then the hydro-turbine governing system state space model is converted into a transfer function model, and the characteristic equation of the transfer function model is extracted, and the system control parameter stability domain is obtained based on the Hurwitz stability criterion; the dominant eigenvalues corresponding to different control parameters in the system control parameter stability domain are calculated, and the control parameters in the system control parameter stability domain are classified according to the oscillation characteristic region of the hydro-turbine governing system of the complex plane where the dominant eigenvalue is located, and the oscillation characteristic region of the hydro-turbine governing system is divided in the system control parameter stability domain.

It can be seen from the above that the present disclosure establishes detailed divisions of control parameters, not only that it is possible to distinguish whether the control parameters are able to stabilize the hydro-turbine governing system, but also distinguish whether the control parameters cause the hydro-turbine governing system to oscillate, and what frequency band of oscillation is generated, as well as whether the generated oscillation decays quickly. Compared with the conventional method which determines oscillation characteristics corresponding to the system control parameters using the time domain simulation method (which requires calculation of $\dot{X}$ and Y), the present disclosure divides the oscillation characteristic region of the hydro-turbine governing system in the system control parameter stability domain, each time the control parameters are adjusted, it is possible to directly obtain the corresponding oscillation characteristics of the hydro-turbine governing system, thereby significantly reducing the processing complexity of control parameters. Moreover, the adjustment of control parameters in the existing methods often requires evaluation by operators, and the divided system control parameter stability domain obtained by the present disclosure is suitable for reference by any operator, and intelligent devices such as computers may also be used to control the hydro-turbine governing system. In this way, the influence of evaluation parameter setting of operators on system oscillation is simplified.

The present disclosure provides a method and a system for correlating control parameters and oscillation characteristics of a hydro-turbine governing system, in which the complex plane oscillation characteristics are mapped to the control parameter stability domain plane. Through the division of control parameters, the safe region for adjustment of the control parameters of ultra-low frequency oscillation may be specifically determined, thereby clarifying the parameter boundaries of risky operations, and helping operators adjust control parameters, thus facilitating the safe operation of the water turbine unit.

It is easy for those skilled in the art to understand that the above descriptions are only preferred embodiments of the present disclosure and are not intended to limit the present disclosure. Any modifications, equivalent substitutions and improvements, etc., made within the spirit and principles of the present disclosure should all be included in the protection scope of the present disclosure.

What is claimed is:

1. A method for correlating control parameters and oscillation characteristics of a hydro-turbine governing system, comprising:
   step 1: calculating, by a processor, an eigenvalue, a zero point and a pole of a state matrix in a hydro-turbine governing system state space model, taking a pole which is the closest to an imaginary axis and has no zero point in a preset distance as a dominant eigenvalue;

step 2: determining, by the processor, an oscillation characteristic region of the hydro-turbine governing system on a complex plane according to the dominant eigenvalue;

step 3: converting, by the processor, the hydro-turbine governing system state space model into a transfer function model and extracting a characteristic equation of the transfer function model, obtaining a system control parameter stability domain according to a Hurwitz stability criterion;

step 4: calculating, by the processor, the dominant eigenvalues corresponding to the different control parameters in the system control parameter stability domain, classifying the control parameters in the system control parameter stability domain according to the oscillation characteristic region of the hydro-turbine governing system of the complex plane where the dominant eigenvalue is located, and dividing the oscillation characteristic region of the hydro-turbine governing system in the system control parameter stability domain;

wherein a horizontal axis of the system control parameter stability domain is $K_p$, and a vertical axis thereof is $K_I$: $K_p$ is a proportional coefficient of a PID (Proportional-Integral-Derivative) speed regulator in the hydro-turbine governing system; $K_I$ is an integral coefficient of the PID speed regulator in the hydro-turbine governing system;

a method for dividing the oscillation characteristic region of the hydro-turbine governing system is: using an imaginary part of the dominant eigenvalue to determine a system oscillation frequency, and dividing the complex plane into a no-oscillation region, a 0 Hz to 0.01 Hz oscillation region, an ultra-low frequency oscillation region, and an oscillation region above 0.1 Hz; a real part of the dominant eigenvalue is used to determine a system attenuation rate, and the ultra-low frequency oscillation region in the complex plane is divided into an ultra-low frequency oscillation safe region and an ultra-low frequency oscillation risk region; if the real part is less than or equal to $-0.07$, the ultra-low frequency oscillation region is divided into the ultra-low frequency oscillation safe region, otherwise the ultra-low frequency oscillation region is divided into the ultra-low frequency oscillation risk region, adjusting, by the processor, a plurality of turbine control parameters which includes PID values of $K_p$ and $K_I$ on a turbine speed regulator of a water turbine based on the control parameters within the ultra-low frequency oscillation safe region, and controlling the water turbine included in the governing system based on the turbine control parameters.

2. The method for correlating the control parameters and the oscillation characteristics of the hydro-turbine governing system according to claim 1, wherein the hydro-turbine governing system state space model comprises a speed regulator sub-model, a water diversion module sub-model, a water turbine sub-model and a generator sub-model.

3. The method for correlating the control parameters and the oscillation characteristics of the hydro-turbine governing system according to claim 1, wherein the characteristic equation of the transfer function model is:

$a_0\lambda^n + a_1\lambda^{n-1} + \ldots + a_{n_o-2}\lambda^2 + a_{n_o-1}\lambda + a_{n_o} = 0$ wherein $\lambda$ is the eigenvalue, $a_i$ is a characteristic equation coefficient, $i=1,2 \ldots n_o$; $n_o$ is a system order, which is determined by the number of state variables in the state space model.

4. The method for correlating the control parameters and the oscillation characteristics of the hydro-turbine governing system according to claim 1, wherein the step 4 is specifically as follows: enumerating the control parameters in the control parameter stability domain according to a fixed step size, calculating the dominant eigenvalue corresponding to each of the control parameters, and classifying the control parameters in the system control parameter stability domain according to the oscillation characteristic region of the hydro-turbine governing system of the complex plane where the dominant eigenvalue is located, calculating the control parameters corresponding to the no-oscillation region, the 0 Hz to 0.01 Hz oscillation region, the ultra-low frequency oscillation region and the oscillation region above 0.1 Hz, thereby realizing a mapping of the oscillation characteristic region of the hydro-turbine governing system to a control parameter stability domain plane.

5. A system for correlating control parameters and oscillation characteristics of a hydro-turbine governing system hydro-turbine governing system, comprising:

a memory, storing at least one module; and a processor, coupled to the memory, wherein the processor is configured to execute;

a building module of a hydro-turbine governing system state space model to build the hydro-turbine governing system state space model;

a dominant eigenvalue acquisition module to calculate an eigenvalue, a zero point and a pole of a state matrix in the hydro-turbine governing system state space model, and taking a pole which is the closest to an imaginary axis and has no zero point in a preset distance as a dominant eigenvalue;

a determining module of an oscillation characteristic region of the hydro-turbine governing system to determine the oscillation characteristic region of the hydro-turbine governing system in a complex plane based on the dominant eigenvalue;

an acquisition module of a system control parameter stability domain to convert the hydro-turbine governing system state space model into a transfer function model, extract a characteristic equation of the transfer function model, and obtain the system control parameter stability domain based on a Hurwitz stability criterion;

a system control parameter stability domain division module to calculate the dominant eigenvalues corresponding to the different control parameters in the system control parameter stability domain, classify the control parameters in the system control parameter stability domain according to the oscillation characteristic region of the hydro-turbine governing system of the complex plane where the dominant eigenvalue is located, and divide the oscillation characteristic region of the hydro-turbine governing system in the system control parameter stability domain;

where a horizontal axis of the system control parameter stability domain is $K_p$, and a vertical axis thereof is $K_I$: $K_p$ is a proportional coefficient of a PID (Proportional-Integral-Derivative) speed regulator in the hydro-turbine governing system; $K_I$ is an integral coefficient of the PID speed regulator in the hydro-turbine governing system;

a method for dividing the oscillation characteristic region of the hydro-turbine governing system is: using an imaginary part of the dominant eigenvalue to determine a system oscillation frequency, and dividing the complex plane into a no-oscillation region, a 0 Hz to 0.01 Hz oscillation region, an ultra-low frequency oscillation region, and an oscillation region above 0.1 Hz; a real part of the dominant eigenvalue is used to determine a system attenuation rate, and the ultra-low frequency oscillation region in the complex plane is divided into an ultra-low frequency oscillation safe region and an ultra-low frequency oscillation risk region; if the real part is less than or equal to −0.07, the ultra-low frequency oscillation region is divided into the ultra-low frequency oscillation safe region, otherwise the ultra-low frequency oscillation region is divided into the ultra-low frequency oscillation risk region, wherein the processor is further configured to adjust a plurality of turbine control parameters which includes PID values of $K_p$ and $K_I$ on a turbine speed regulator of a water turbine based on the control parameters within the ultra-low frequency oscillation safe region, and controlling the water turbine included in the governing system based on the turbine control parameters.

6. He system for correlating the control parameters and the oscillation characteristics of the hydro-turbine governing system according to claim 5, wherein the hydro-turbine governing system state space model comprises a speed regulator sub-model, a water diversion module sub-model, a water turbine sub-model and a generator sub-model.

7. The system for correlating the control parameters and the oscillation characteristics of the hydro-turbine governing system according to claim 5, where the characteristic equation of the transfer function model in the acquisition module of the system control parameter stability domain is:

$a_0\lambda^n + a_1\lambda^{n_o-1} + \ldots + a_{n_o-2}\lambda^2 + a_{n_o-1}\lambda + a_{n_o} = 0$ wherein $\lambda$ is the eigenvalue, $a_i$ is a characteristic equation coefficient, $i=1, 2, \ldots, n_o$; $n_o$ is a system order, which is determined by the number of state variables in the state space model.

8. The system for correlating the control parameters and the oscillation characteristics of the hydro-turbine governing system according to claim 5, wherein the method for dividing the system control parameter stability domain by using the system control parameter stability domain division module is as follows:

enumerating the control parameters in the control parameter stability domain according to a fixed step size, calculating the dominant eigenvalue corresponding to each of the control parameters, and classifying the control parameters in the system control parameter stability domain according to the oscillation characteristic region of the hydro-turbine governing system of the complex plane where the dominant eigenvalue is located, calculating the control parameters corresponding to the no-oscillation region, the 0 Hz to 0.01 Hz oscillation region, the ultra-low frequency oscillation region and the oscillation region above 0.1 Hz, thereby realizing a mapping of the oscillation characteristic region of the hydro-turbine governing system to a control parameter stability domain plane.

* * * * *